United States Patent
Passlack et al.

[11] Patent Number: 5,945,718
[45] Date of Patent: Aug. 31, 1999

[54] SELF-ALIGNED METAL-OXIDE-COMPOUND SEMICONDUCTOR DEVICE AND METHOD OF FABRICATION

[75] Inventors: Matthias Passlack, Chandler; Jonathan Kwadwo Abrokwah, Tempe; Zhiyi Yu, Gilbert, all of Ariz.

[73] Assignee: Motorola Inc., Schaumburg, Ill.

[21] Appl. No.: 09/022,593

[22] Filed: Feb. 12, 1998

[51] Int. Cl.$^6$ .................................................. H07L 29/78
[52] U.S. Cl. ........................ 257/410; 257/192; 257/631
[58] Field of Search .................................. 257/410, 411, 257/192, 631

[56] References Cited

U.S. PATENT DOCUMENTS

| | | | |
|---|---|---|---|
| 4,416,952 | 11/1983 | Nishizawa et al. | 428/698 |
| 4,843,450 | 6/1989 | Kirchner et al. | 257/38 |
| 5,124,762 | 6/1992 | Childs et al. | 357/16 |
| 5,451,548 | 9/1995 | Hunt et al. | 437/225 |
| 5,550,089 | 8/1996 | Dutta et al. | 437/225 |
| 5,597,768 | 1/1997 | Passlack et al. | 437/236 |
| 5,665,658 | 9/1997 | Passlack | 438/763 |

OTHER PUBLICATIONS

An article entitled "Thermodynamic and photochemical stability of low interface state density $Ga_2O_3$–GaAs structures fabricated by in situ molecular beam epitaxy" from Appl. Phys. Lett. 69(3), M. Passlack et al., pp. 302–304 (Jul. 15, 1996).

An article entitled "Recombination velocity at oxide–GaAs interfaces fabricated by in situ molecular beam epitaxy" from Appl. Phys. Lett. 68(25), M. Passlack et al., pp. 3605–3607 (Jun. 17, 1996).

An article entitled "Quasistatic and high frequency capacitance–voltage characterization of $Ga_2O_3$–GaAs structures fabricated by in situ molecular beam epitaxy" from Appl. Phys. Lett. vol. 68, No. 8, M. Passlack et al., pp. 1099–1101 (Feb. 19, 1996).

An article entitled "Anisotropy of electrical and optical properties in B–$Ga_2O_3$ single crystals" from Appl. Phys. Lett. 71(7), N. Ueda et al., pp. 933–935 (Aug. 18, 1997).

An article entitled "Synthesis and control of conductivity of ultraviolet transmitting B–$Ga_2O_3$ single crystals" from Appl. Phys. Lett. 70(26), N. Ueda, pp. 3561–3563 (Jun. 30, 1997).

*Primary Examiner*—David B. Hardy
*Attorney, Agent, or Firm*—Gregory J. Gorrie

[57] ABSTRACT

A self-aligned enhancement mode metal-oxide-compound semiconductor FET (10) includes a stoichiometric $Ga_2O_3$ gate oxide layer (14) positioned on upper surface (16) of a compound semiconductor wafer structure (13). The stoichiometric $Ga_2O_3$ layer forms an atomically abrupt interface with the compound semiconductor wafer structure. A refractory metal gate electrode (17) is positioned on upper surface (18) of the stoichiometric $Ga_2O_3$ gate oxide layer (14). The refractory metal is stable on the stoichiometric $Ga_2O_3$ gate oxide layer at elevated temperature. Self-aligned source and drain areas, and source and drain contacts (19, 20) are positioned on the source and drain areas (21, 22).

18 Claims, 4 Drawing Sheets

5,945,718

SELF-ALIGNED METAL-OXIDE-COMPOUND SEMICONDUCTOR DEVICE AND METHOD OF FABRICATION

FIELD OF THE INVENTION

The present invention pertains to compound semiconductor field effect devices and more specifically to enhancement mode self-aligned metal-oxide-compound semiconductor transistors and methods of fabrication.

BACKGROUND OF THE INVENTION

Metal-oxide-semiconductor field effect transistors (MOSFET) are the workhorse of the silicon (Si) semiconductor industry. The rapid advance of portable electronic systems and the exponential increase in integration density has spurred the transition to low-power technologies. Reduction of the supply voltage is key for reducing power dissipation. At the present time, Si CMOS offers significant advantages in terms of integration level and cost; however, reductions in circuit speed of scaled Si CMOS (including SOI) are anticipated as the power supply is reduced to 1 V or below. In contrast to Si, complementary GaAs exhibits optimum speed/power performance and efficiency at a low supply voltage of 1 V and below.

For compound semiconductors, prior art comprises the use of a metal-semiconductor junction as a gate electrode in field effect transistors instead of the standard metal-oxide-semiconductor junction employed in Si technology. The use of a metal semiconductor junction, however, results in excessive leakage current, high power dissipation, reduced logic swing, reduced design flexibility, and limited device performance. Consequently, optimum device performance and high IC integration levels could not be realized and commercial marketability has been limited.

Thus what is needed are new and improved compound semiconductor devices and methods of fabrication which overcome these problems. What is also needed are new and improved compound semiconductor field effect transistors (FET). What is also needed are new and improved compound semiconductor FETs using metal-oxide-semiconductor junctions (MOSFET). What is also needed are new and improved compound semiconductor MOSFETs using a self-aligned gate structure. What is also needed are new and improved self-aligned compound semiconductor MOSFETs using enhancement mode operation. What is also needed are new and improved self-aligned compound semiconductor MOSFETs with stable and reliable device operation. What is also needed are new and improved self-aligned compound semiconductor MOSFETs which enable optimum compound semiconductor device performance. What is also needed are new and improved self-aligned compound semiconductor MOSFETs with optimum efficiency and output power for RF and microwave applications. What is also needed are new and improved self-aligned compound semiconductor MOSFETs for use in complementary circuits and architectures. What is also needed are new and improved self-aligned compound semiconductor MOSFETs for low power/high performance complementary circuits and architectures. What is also needed are new and improved self-aligned compound semiconductor MOSFETs which offer the design flexibility of complementary architectures. What is also needed are new and improved self-aligned compound semiconductor MOSFETs which keep interconnection delays in ULSI under control.

What is also needed are new and improved methods of fabrication of self-aligned compound semiconductor MOSFETs. What is also needed is new and improved methods of fabrication of self-aligned compound semiconductor MOSFETs which are compatible with established complementary GaAs heterostructure FETs (CGaAs) technologies. What is also needed are new and improved compound semiconductor MOSFETs which are relatively easy to fabricate and use.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a self-aligned enhancement mode metal-oxide-compound semiconductor FET. The FET includes a stoichiometric $Ga_2O_3$ gate oxide layer positioned on upper surface of a compound semiconductor wafer structure. The stoichiometric $Ga_2O_3$ layer forms an atomically abrupt interface with the compound semiconductor wafer structure. A refractory metal gate electrode is preferably positioned on upper surface of the stoichiometric $Ga_2O_3$ gate oxide layer. The refractory metal is stable on the stoichiometric $Ga_2O_3$ gate oxide layer at elevated temperature. Self-aligned source and drain areas, and source and drain contacts are positioned on the source and drain areas. In a preferred embodiment, the metal-oxide-compound semiconductor transistor includes a stoichiometric $Ga_2O_3$ gate oxide layer of 40–200 Å thickness positioned on upper surface of a compound semiconductor heterostructure. The compound semiconductor heterostructure comprises $Al_xGa_{1-x}As$ and $In_yGa_{1-y}As$ layers which are grown on a compound semiconductor substrate, a refractory metal gate of W, WN, or WSi, self aligned donor (n-channel FET) or acceptor (p-channel FET) implants, and source and drain ohmic contacts.

Figure 1:
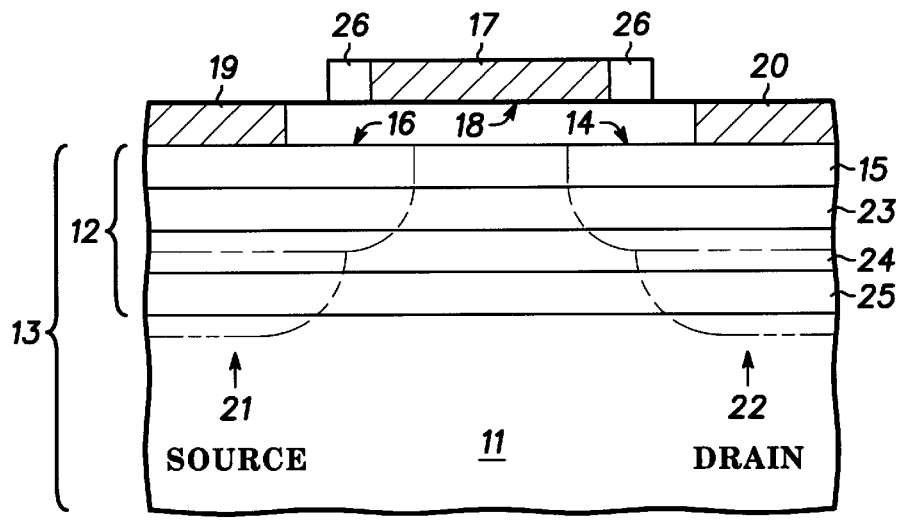
FIG. 1 is simplified cross sectional view of a self-aligned enhancement mode compound semiconductor MOSFET in accordance with a preferred embodiment of the present invention.

FIG. 1 is simplified cross sectional view of a self-aligned enhancement mode compound semiconductor MOSFET in accordance with a preferred embodiment of the present invention. Device 10 includes a compound semiconductor material, such as any III–V material employed in any semiconductor device, represented herein by a III–V semiconductor substrate 11 and a compound semiconductor epitaxial layer structure 12. For the purpose of this disclosure, the substrate 11 and any epitaxial layer structure 12 formed thereon will be referred to simply as a compound semiconductor wafer structure which in FIG. 1 is designated 13. Methods of fabricating semiconductor wafer structure 13 include, but are not limited to, molecular beam epitaxy (MBE) and metal organic chemical vapor deposition (MOCVD). It will of course be understood that in some specific applications, there may be no epitaxial layers present and upper surface of top layer 15 may simply be the upper surface of substrate 11.

Device 10 further comprises a stoichiometric $Ga_2O_3$ gate oxide layer 14 positioned on upper surface of top layer 15 of compound semiconductor wafer structure 13 wherein oxide layer 14 forms an atomically abrupt interface 16 with the upper surface of top layer 15. A refractory metal gate electrode 17 which is stable in the presence of $Ga_2O_3$ at elevated temperature is positioned on upper surface 18 of stoichiometric $Ga_2O_3$ gate oxide layer 14. Dielectric spacers 26 are positioned to cover the sidewalls of metal gate electrode 17. Source and drain contacts 19 and 20 are deposited on self-aligned source and drain areas 21 and 22, respectively.

In a specific embodiment, the epitaxial layer structure consists of a 5–10 Å GaAs top layer 15, a 10–100 Å AlGaAs spacer layer 23, a 100–250 Å InGaAs channel layer 24, and a GaAs buffer layer 25 grown on a GaAs substrate 11. The separation of the conducting channel forming in layer 24 from interface 16 using spacer layer 23 significantly improves the device reliability and stability and assures optimum device performance. Top GaAs layer 15 is used to form an atomically abrupt $Ga_2O_3$—GaAs interface with low defect density.

As a simplified example of fabricating a self-aligned enhancement mode compound semiconductor MOSFET in accordance with a preferred embodiment of hte present invention, a III–V compound semiconductor wafer structure 13 with an atomically ordered and chemically clean upper surface of top layer 15 is prepared in an ultra-high vacuum semiconductor growth chamber and transferred via a preparation chamber to an oxide deposition chamber. $Ga_2O_3$ layer 14 is deposited on upper surface of top layer 15 using thermal evaporation from a crystalline $Ga_2O_3$ source. A refractory metal which is stable on $Ga_2O_3$ at elevated temperature such as WSi or WN is deposited on upper surface 18 of oxide layer 14 and subsequently patterned using standard lithography. The refractory metal layer is etched until oxide layer 14 is exposed using a refractory metal etching technique such as a fluorine based dry etching process. The refractory metal etching procedure does not etch the oxide layer 14, thus, oxide layer 14 functions as an etch stop layer such that upper surface of top layer 15 remains protected by oxide layer 14. All processing steps are performed using low damage plasma processing. Self-aligned source and drain areas 21 and 22, respectively are realized by ion implantation of Si (n-channel device) and Be/F (p-channel device) using the refractory metal gate electrode 17 and the dielectric spacers 26 as implantation masks. Such ion implantation schemes are compatible with standard processing of complementary heterostructure FET technologies and are well known to those skilled in the art. The implants are activated at 700° C. using rapid thermal annealing such that degradation of the interface 16 established between top layer 15 and oxide layer 14 is excluded. Finally, ohmic source and drain contacts 19 and 20 are deposited on the self-aligned source and drain areas 21 and 22, respectively.

Figure 2:
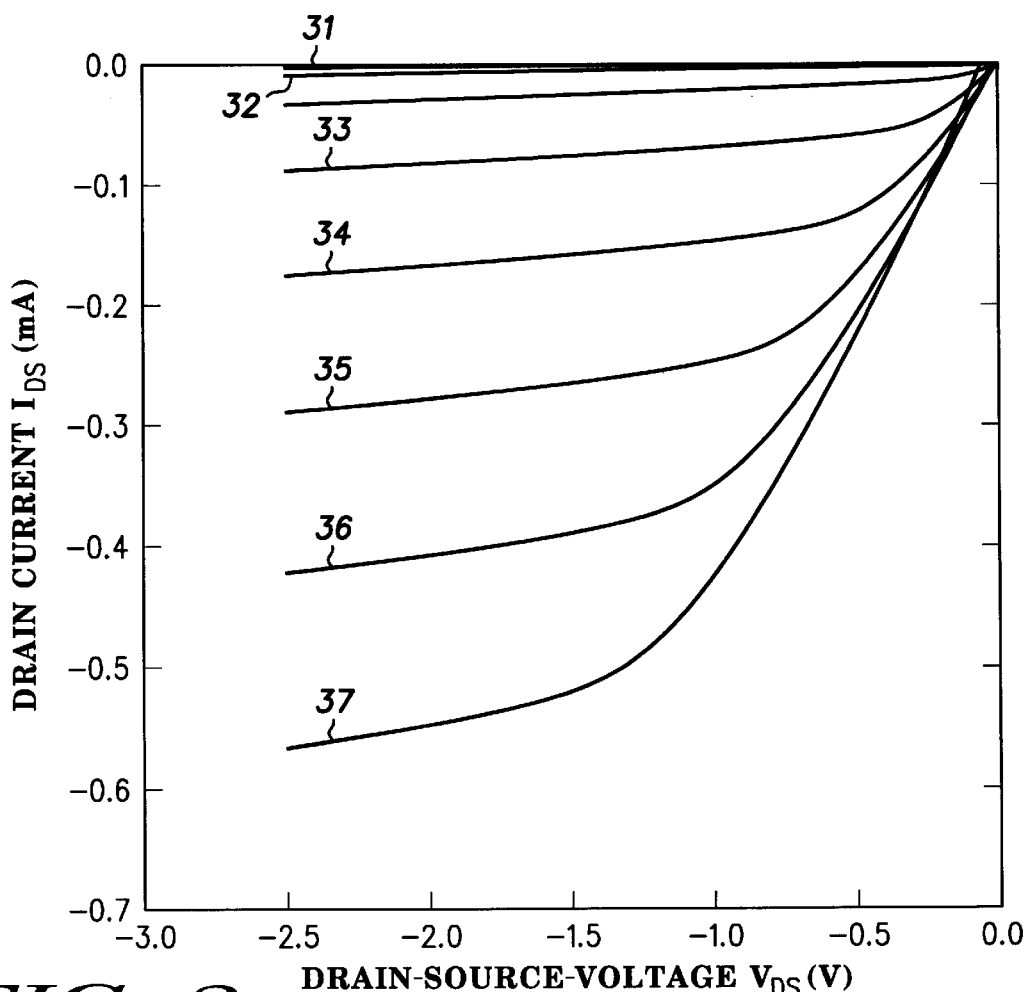
FIG. 2 is a graph illustrating measured output characteristics of a p-channel self-aligned enhancement mode compound semiconductor MOSFET in accordance with a preferred embodiment of the present invention.
Figure 3:
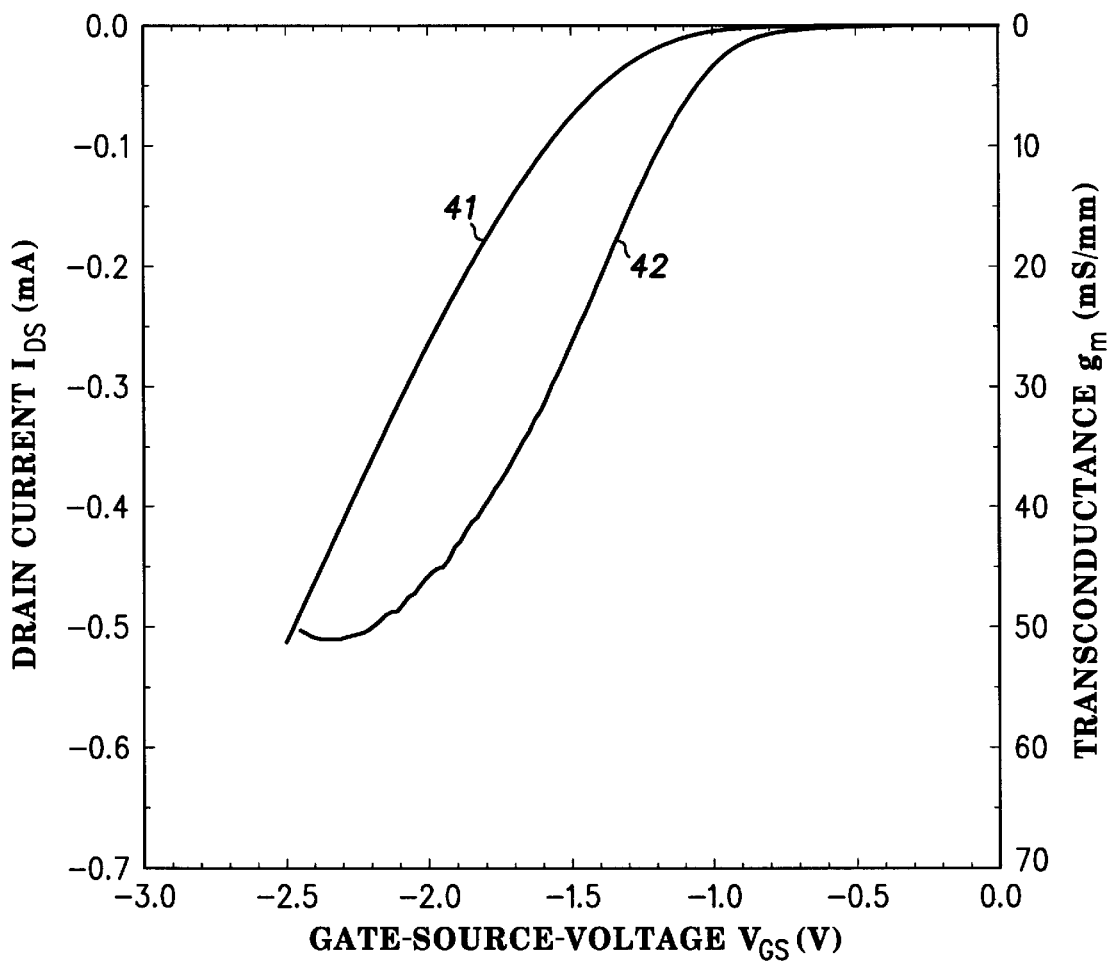
FIG. 3 is a graph illustrating transfer characteristics and transconductance of a p-channel self-aligned enhancement mode compound semiconductor MOSFET in accordance with a preferred embodiment of the present invention.

FIG. 2 is a graph illustrating measured output characteristics of a p-channel self-aligned enhancement mode compound semiconductor MOSFET in accordance with a preferred embodiment of the present invention. FIG. 3 is a graph illustrating transfer characteristics and transconductance of a p-channel self-aligned enhancement mode compound semiconductor MOSFET in accordance with a preferred embodiment of the present invention. In FIG. 2, the measured output characteristics 31, 32, 33, 34, 35, 36, and 37 are shown for a gate voltage $V_{GS}$=−1, −1.25, −1.5, −1.75, −2, −2.25, and −2.5 V, respectively. In FIG. 3, transfer characteristics 41 and transconductance 42 are shown for a 0.6 μm p-channel self-aligned enhancement mode GaAs based MOS-HFET (metal-oxide-semiconductor heterostructure FET) fabricated according to a preferred embodiment of the present invention. The GaAs based MOS-HFET uses a 150 Å thick $In_{0.2}Ga_{0.8}As$ channel. The oxide thickness is 90 Å. Note that the relative dielectric constant of 10 for $Ga_2O_3$ yields an equivalent oxide thickness of 35 Å. Including the 100 Å thick $Al_{0.75}Ga_{0.25}As$ spacer layer, the equivalent distance between gate and channel increases to 72 Å. The gate width of the device is 10 μm. The threshold voltage is −0.93 V and a maximum transconductance of 51 mS/mm is measured at $V_{GS}$=−2.35 V. The threshold voltage and maximum transconductance measured over a 3 inch wafer are −0.93±0.1 V and 46.7±3.9 mS/mm.

Figure 4:
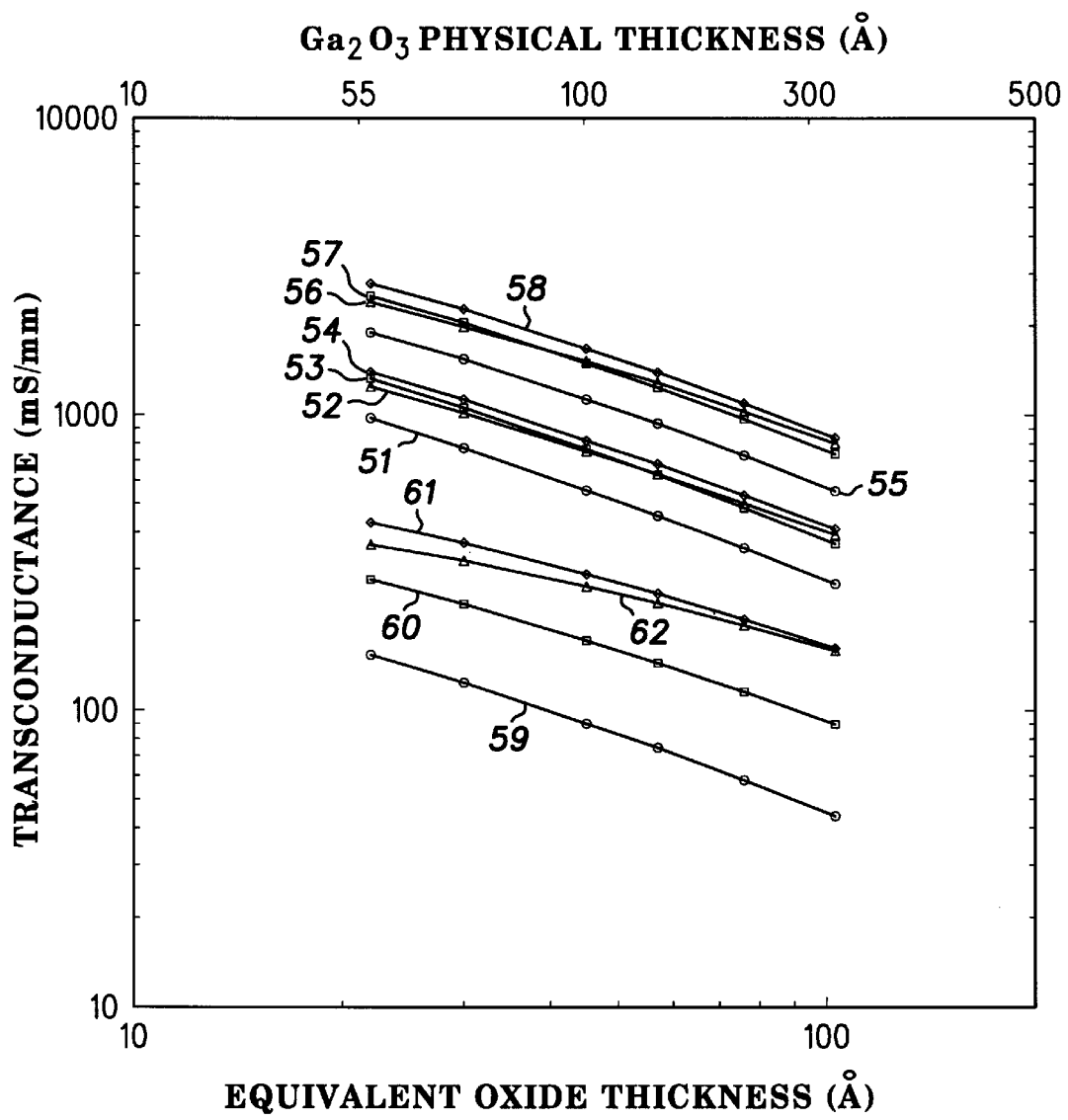
FIG. 4 is a graph illustrating predicted performance of optimized self-aligned enhancement mode compound semiconductor MOSFETs in accordance with a preferred embodiment of the present invention.

FIG. 4 is a graph illustrating predicted performance of optimized self-aligned enhancement mode compound semiconductor MOSFETs in accordance with a preferred embodiment of the present invention. The predicted performance of n- and p-type GaAs based MOS-HFETs fabricated according to a preferred embodiment of the present invention is shown for n-channel devices with 20% In content (curves 51, 52, 53, 54) and 50% or higher In content in the channel (55, 56, 57, 58), and for p-channel devices (59, 60, 61, 62) having a gate length of 1, 0.5, 0.2, and 0.1 μm, respectively. For a physical oxide thickness of 40 Å, a maximum transconductance $g_m$ of =0.5, 1.3, and 3 S/mm is anticipated at 1 V for p-type devices and n-type devices with 20% and more than 50% In content in the channel, respectively. For maximum $g_m$, scaling to a minimum feature size of 0.2 μm is apparently sufficient. Note that high $g_m$ of the order of 2 S/mm and higher is of paramount importance for ULSI in order to keep interconnection delay under control.

Figure 5:
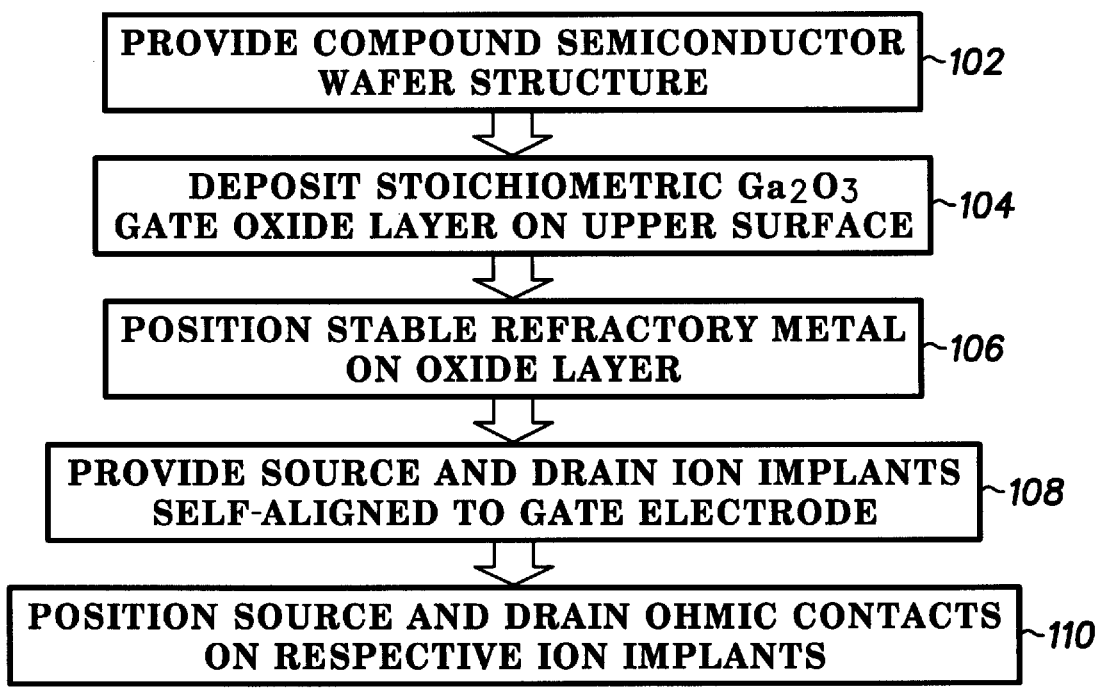
FIG. 5 is a simplified flow chart illustrating a method of manufacturing a self-aligned enhancement mode compound semiconductor MOSFET in accordance with a preferred embodiment of the present invention.

FIG. 5 is a simplified flow chart illustrating a method of manufacturing a self-aligned enhancement mode compound semiconductor MOSFET in accordance with a preferred embodiment of the present invention. In step 102, a compound semiconductor wafer structure is provided. In step 104, a stoichiometric $Ga_2O_3$ gate oxide layer is deposited on upper surface of said compound semiconductor wafer structure. In step 106, a stable refractory gate metal is positioned on upper surface of said stoichiometric$Ga_2O_3$ gate oxide layer. In step 108, source and drain ion implants are provided self-aligned to the gate electrode. In step 110, source and drain ohmic contacts are positioned on ion implanted source and drain areas.

In a preferred embodiment, step 102 includes the preparation of an atomically ordered and chemically clean upper surface of the compound semiconductor wafer structure. Step 104 preferably comprises thermal evaporation from a crystalline $Ga_2O_3$ source on an atomically ordered and chemically clean upper surface of the compound semiconductor wafer structure. The $Ga_2O_3$ gate oxide layer preferably functions as an etch stop layer such that the upper surface of the compound semiconductor wafer structure remains protected by the gate oxide during and after gate metal etching. The refractory gate metal desirably does not react with or diffuse into the gate oxide layer during high temperature annealing of the self-aligned source and drain ion implants. The quality of the interface formed by the gate oxide layer and the upper surface of the compound semiconductor structure is desirably preserved during high temperature annealing of the self-aligned source and drain ion implants. The self-aligned source and drain implants are desirably annealed at approximately 700° C. using rapid thermal annealing. The self-aligned source and drain implants are desirably realized by positioning dielectric spacers on the sidewalls of the refractory gate metal.

Thus, new and improved compound semiconductor devices and methods of fabrication are disclosed. The new and improved self-aligned enhancement mode metal-oxide-compound semiconductor heterostructure field effect transistors enable stable and reliable device operation, provide optimum compound semiconductor device performance for low power/high performance complementary circuits and architectures, keep interconnection delay in ULSI under control, and provide optimum efficiency and output power for RF and microwave applications.

The invention has been described in conjunction with the illustrative embodiment of the invention. As will be apparent to those skilled in the art, various changes and modifications may be made to the above-described embodiment without departing from the spirit or scope of the invention. It is intended that the invention be limited not by the illustrative embodiment, but be limited only by the scope of the claims appended hereto.

What is claimed is:

1. An enhancement mode metal-oxide-compound semiconductor field effect transistor comprising:

a compound semiconductor wafer structure having an upper surface;

a stoichiometric $Ga_2O_3$ gate oxide layer positioned on upper surface of said compound semiconductor wafer structure;

a stable refractory metal gate electrode positioned on upper surface of said stoichiometric $Ga_2O_3$ gate oxide layer;

source and drain ion implants self-aligned to the gate electrode; and source and drain ohmic contacts positioned on ion implanted source and drain areas, wherein the refractory metal gate electrode comprises a refractory metal selected from the group consisting of W, WN or WSi or combinations thereof.

2. An enhancement mode metal-oxide-compound semiconductor field effect transistor as claimed in claim 1 wherein the stoichiometric $Ga_2O_3$ gate oxide layer forms an atomically abrupt interface with the upper surface of the compound semiconductor wafer structure.

3. An enhancement mode metal-oxide-compound semiconductor field effect transistor as claimed in claim 1 wherein the stoichiometric $Ga_2O_3$ gate oxide layer has a thickness of 20–200 Å.

4. An enhancement mode metal-oxide-compound semiconductor field effect transistor as claimed in claim 1 wherein the $Ga_2O_3$ gate oxide layer protects the upper surface of the compound semiconductor wafer structure.

5. An enhancement mode metal-oxide-compound semiconductor field effect transistor as claimed in claim 1 wherein the refractory metal gate electrode comprises a refractory metal which is stable in presence of a $Ga_2O_3$ gate oxide layer at an elevated temperature of 700° C. and above.

6. An enhancement mode metal-oxide-compound semiconductor field effect transistor as claimed in claim 1 wherein the source and drain ion implants comprise Sisaid enhancement mode metal-oxide-compound semiconductor field effect transistor being an n-channel device.

7. An enhancement mode metal-oxide-compound semiconductor field effect transistor as claimed in claim 1 wherein the source and drain ion implants comprise and Be/F, said enhancement mode metal-oxide-compound semiconductor field effect transistor being a p-channel device.

8. An enhancement mode metal-oxide-compound semiconductor field effect transistor as claimed in claim 1 wherein the upper surface of the compound semiconductor wafer structure comprises GaAs.

9. An enhancement mode metal-oxide-compound semiconductor field effect transistor comprising:

a compound semiconductor wafer structure having an upper surface;

a stoichiometric $Ga_2O_3$ gate oxide layer positioned on upper surface of said compound semiconductor wafer structure;

a stable refractory metal gate electrode positioned on upper surface of said stoichiometric $Ga_2O_3$ gate oxide layer;

source and drain ion implants self-aligned to the gate electrode; and source and drain ohmic contacts positioned on ion implanted source and drain areas, wherein dielectric spacers are positioned on sidewalls of the stable refractory gate metal electrode.

10. An enhancement mode metal-oxide-compound semiconductor field effect transistor comprising:

a compound semiconductor wafer structure having an upper surface;

a stoichiometric $Ga_2O_3$ gate oxide layer positioned on upper surface of said compound semiconductor wafer structure;

a stable refractory metal gate electrode positioned on upper surface of said stoichiometric $Ga_2O_3$ gate oxide layer;

source and drain ion implants self-aligned to the gate electrode; and source and drain ohmic contacts positioned on ion implanted source and drain areas, wherein the compound semiconductor wafer structure comprises a wider band gap spacer layer and a narrower band gap channel layer.

11. An enhancement mode metal-oxide-compound semiconductor field effect transistor as claimed in claim 10 wherein the wider band gap spacer layer is positioned between the gate oxide layer and the narrower band gap channel layer.

12. An enhancement mode metal-oxide-compound semiconductor field effect transistor as claimed in claim 11 wherein the wider band gap spacer layer has a thickness of between 3–200 Å.

13. An enhancement mode metal-oxide-compound semiconductor field effect transistor as claimed in claim 11 wherein the wider band gap spacer layer comprises either $Al_xGa_{1-x}As$ or $In_zGa_{1-z}P$ or a combination thereof.

14. An enhancement mode metal-oxide-compound semiconductor field effect transistor as claimed in claim 13 wherein the narrower band gap channel layer has a thickness of 10–300 Å.

15. An enhancement mode metal-oxide-compound semiconductor field effect transistor as claimed in claim 10 wherein the narrower band gap channel layer is positioned between the wider band gap spacer layer and a buffer layer.

16. An enhancement mode metal-oxide-compound semiconductor field effect transistor as claimed in claim 15 wherein the narrower band gap channel layer comprises $In_yGa_{1-y}As$.

17. An enhancement mode metal-oxide-compound semiconductor field effect transistor comprising:

a compound semiconductor wafer structure having an upper surface;

a stoichiometric $Ga_2O_3$ gate oxide layer positioned on upper surface of said compound semiconductor wafer structure;

a stable refractory metal gate electrode positioned on upper surface of said stoichiometric $Ga_2O_3$ gate oxide layer;

source and drain ion implants self-aligned to the gate electrode; and source and drain ohmic contacts positioned on ion implanted source and drain areas, wherein the compound semiconductor wafer structure comprises a $Al_xGa_{1-x}As$, $In_yGa_{1-y}As$, or $In_zGa_{1-z}P$ layer, said layer being positioned on upper surface of a compound semiconductor substrate.

18. An enhancement mode metal-oxide-compound semiconductor field effect transistor as claimed in claim 17 wherein the compound semiconductor substrate includes a GaAs based semiconductor wafer.

* * * * *

UNITED STATES PATENT AND TRADEMARK OFFICE
CERTIFICATE OF CORRECTION

PATENT NO. : 5,945,718
DATED : August 31, 1999
INVENTOR(S) : Matthias Passlack et al.

It is certified that error appears in the above-identified patent and that said Letters Patent is hereby corrected as shown below:

Title page,
Item [75], Inventors, delete "Shiyi Yu" and replace with -- Zhiyi (Jimmy) Yu --; and add -- Ravindranath Droopad, Tempe --

Column 6,
Line 6, delete "Sisaid" and replace with -- Si, said --.

Signed and Sealed this

Twenty-fifth Day of January, 2005

JON W. DUDAS
*Director of the United States Patent and Trademark Office*